US010192737B2

(12) United States Patent
Georgakilas et al.

(10) Patent No.: US 10,192,737 B2
(45) Date of Patent: Jan. 29, 2019

(54) METHOD FOR HETEROEPITAXIAL GROWTH OF III METAL-FACE POLARITY III-NITRIDES ON SUBSTRATES WITH DIAMOND CRYSTAL STRUCTURE AND III-NITRIDE SEMICONDUCTORS

(71) Applicant: Foundation for Research and Technology, Heraklion, Crete (GR)

(72) Inventors: Alexandros Georgakilas, Crete (GR); Kleopatra Aretouli, Athens (GR); Katerina Tsagaraki, Crete (GR)

(73) Assignee: Foundation for Research and Technology, Heraklion (GR)

( * ) Notice: Subject to any disclaimer, the term of this patent is extended or adjusted under 35 U.S.C. 154(b) by 155 days.

(21) Appl. No.: 14/396,842

(22) PCT Filed: Apr. 24, 2013

(86) PCT No.: PCT/EP2013/058560
§ 371 (c)(1),
(2) Date: Oct. 24, 2014

(87) PCT Pub. No.: WO2013/160383
PCT Pub. Date: Oct. 31, 2013

(65) Prior Publication Data
US 2015/0144954 A1 May 28, 2015

(30) Foreign Application Priority Data
Apr. 25, 2012 (GR) .................................. 120100227

(51) Int. Cl.
*H01L 21/02* (2006.01)
*H01L 29/20* (2006.01)
(Continued)

(52) U.S. Cl.
CPC .......... *H01L 21/0254* (2013.01); *C30B 23/02* (2013.01); *C30B 29/403* (2013.01);
(Continued)

(58) Field of Classification Search
CPC ................................................... H01L 21/0254
(Continued)

(56) References Cited

U.S. PATENT DOCUMENTS 5,766,783 A * 6/1998 Utsumi ............... C23C 14/0641
428/336
6,391,748 B1 * 5/2002 Temkin ................... C30B 23/02
257/E21.127
(Continued)

OTHER PUBLICATIONS

"Key issues for the growth of high quality (Al,Ga)N/GaN and GaN/(IN,Ga)N heterostructures on Si (0001) by molecular beam epitaxy" O. Brandt et al. (Brandt) Applied Surface Science 175-176 (2001) 419-427.*
(Continued)

*Primary Examiner* — Erik T Peterson
(74) *Attorney, Agent, or Firm* — Brooke Schumm, III; Daneker, McIntire Schumm et al

(57) ABSTRACT

The present invention discloses a method of heteroepitaxial growth enabling the successful growth of thin films of GaN and III-nitride semiconductor heterostructures of (0001) orientation with III metal-face polarity on diamond substrates being either polycrystalline or single crystal with various crystallographic orientations. The method uses a thin AlN nucleation layer on the diamond substrate with thickness equal or less than 5 nm, grown by Molecular Beam Epitaxy (MBE) using a nitrogen plasma source. The invention enables the development of very high power metal-face III-nitride devices, such as High Electron Mobility Transistors, on single crystal or polycrystalline diamond substrates.

(Continued)

The method is also applicable for other element IV substrates with diamond crystal structure.

8 Claims, 9 Drawing Sheets

(51) Int. Cl.
*H01L 29/778* (2006.01)
*C30B 23/02* (2006.01)
*C30B 29/40* (2006.01)

(52) U.S. Cl.
CPC .... *H01L 21/0262* (2013.01); *H01L 21/02304* (2013.01); *H01L 21/02315* (2013.01); *H01L 21/02373* (2013.01); *H01L 21/02376* (2013.01); *H01L 21/02378* (2013.01); *H01L 21/02428* (2013.01); *H01L 21/02433* (2013.01); *H01L 21/02458* (2013.01); *H01L 21/02502* (2013.01); *H01L 21/02631* (2013.01); *H01L 21/02645* (2013.01); *H01L 21/02661* (2013.01); *H01L 29/2003* (2013.01); *H01L 29/7786* (2013.01)

(58) Field of Classification Search
USPC .......................................................... 257/76
See application file for complete search history.

(56) References Cited

U.S. PATENT DOCUMENTS

| | | | |
|---|---|---|---|
| 2003/0056719 A1* | 3/2003 | Kouvetakis | C30B 25/02 117/104 |
| 2003/0145784 A1* | 8/2003 | Thompson | C30B 23/02 117/92 |
| 2004/0224459 A1* | 11/2004 | Nishikawa | C30B 23/02 438/202 |
| 2005/0087753 A1* | 4/2005 | D'Evelyn | C30B 9/00 257/98 |
| 2005/0106849 A1* | 5/2005 | Gwo | H01L 21/02381 438/602 |
| 2007/0295990 A1* | 12/2007 | Higashiwaki | H01L 29/0603 257/192 |
| 2010/0117118 A1* | 5/2010 | Dabiran | H01L 29/207 257/190 |
| 2015/0144954 A1* | 5/2015 | Georgakilas | H01L 21/02373 257/76 |

OTHER PUBLICATIONS

"GaN grown on (111) single crystal diamond substrate by molecular beam epitaxy" A. Dussaigne et al. (Dussaigne), Journal of Crystal Growth 311 (2009) 4539-4542.*
"Molecular beam epitaxial growth of normal and inverted two-dimensional electron gases in AlGaN/GaN based heterostructures" M. J. Murphy et al. (Murphy) J. Vac. Sci. Technol. B, vol. 17, No. 3, May/Jun. 1999 pp. 1252-1254.*
Davis et al. "Conventional and pendeo-epitaxial growth of GaN(0 0 0 1) thin films on Si(1 1 1) substrates" Journal of Crystal Growth 231, 2001, pp. 335-341.*
Jiang et al. "Growth of GaN epitaxial films on polycrystalline diamond by metal-organic vapor phase epitaxy" J. Phys. D: Appl. Phys. 50, 2017, 165103 (7pp).*
Program for the 4th International Conference on Micro-Nanoelectronics, Nanotechnologies & MEMs, NCSR Demokritos, Athens, Dec. 12-15, 2010.*
Adikimenakis et al. "Epitaxial growth of (0001) GaN heterostructures on polycrystalline diamond substrates", 14th International conference on Microelectronics, Nanoelectronics, Nanotechnologies & MEMs, Athens, Greece, Dec. 12-14, 2010, Paper 010.*
Dussaigne, A et al, "GaN grown on (11) single crystal diamond substate by molecular beam epitxy," vol. 311, No. 21, Journal of Crystal Growth, pp. 4539-4542 Oct. 15, 2009, published by Elsevier B.V., Amsterdam, NL.
Brandt O et al, "Key Issues for the Growth of High Duality (Al, Ga) N/GaN and GaN/(In,Ga)N heterostructures on SiC (0 0 0 1) by molecular beam epitaxy," vol. 175-176, Applied Surface Science pp. 419-427, May 15, 2001, published by Elsevier Science, B.V., Amsterdam, NL.
Murphy, M J et al, "Molecular beam epitaxial growth of normal and inverted two-dimensional electron gases in AlGaN/GaN based heterostructures," vol. 17,No. 3 Journal of Vacuum Science & Technology B: Microelectronics Processing and Phenomena, (May-Jun. 1999) pp. 1252-1254, May 1, 1999, published by American Vacuum Society, pp. New York, NY, US.
Hageman, P.R. et al, "GaN growth on single-crystal diamond substrates by metalorganic chemical vapour deposition and hydride vapour deposition," vol. 443, No. 1-2, Thin Solid Films, pp. 9-13, Oct. 22, 2003, published by Elsevier-Sequoia S.A., Lausanne CH (Elsevier B.V. Amsterdam, NL).
D. Francis, Formation and characterization of 4-inch GaN-on-diamond substrates. Diamond & Related Materials 19 (2010) 229-233, published by Elsevier B.V., Amsterdam, NL.
G. P. Dimitrakopulos et al, "Microstructure of N-face InN grown on Si (111) by plasma-assisted MBE using a thin GaN-AlN buffer layer", Phys. Stat. Solidi (a) 207 (2010) 1074.
K. Tsagaraki, A. Georgakilas. Report on FORTH results for orientation and polarity of GaN/AlN heterostructures grown by N2 plasma source MBE on different Si substrate orientations. Jul. 31, 2017.
V. Lebedev et al, "Hexagonal AlN films grown on nominal and off-axis Si (001) substrates", J. Crystal Growth 230 (2001) 426.
S. Joblot et al, "High-electron-mobility AlGaN/GaN heterostructures grown on Si (001) by molecular beam epitaxy", Applied Physics Letters 87 (2005), 133505.
Dadgar et al, "Epitaxy of GaN on silicon—impact of symmetry and surface reconstruction", New Journal of Physics 9 (2007) 389 (http://www.njp.org/).
Q. Jian et al, J. Phys. D: Appl. Phys. 50 (2017) 165103.
Slides, A. Adikimenakis, et al, "Epitaxial growth of (0001) GaN heterostructures on polycrystalline diamond substrates," Session 3, Mon. Dec. 13, 2010, 4th Int'l Conf. on Micro-Nanoeletronics, Nanotechnologies and MEMS, NCSR Demokritos, Athens, Dec. 12-15, 2010, presentation slides requested on p. 13, point 2 is submitted.
B. Pécz et al, "Structural characteristics of single crystalline GaN films grown on (111) diamond with AlN buffer", Diamond & Related Materials 34 (2013) 9.
Sumiya, M. and Fuke, S. Review of polarity determination and control of GaN. MRS Internet J. Nitride Semicond. Res. 9, 1(2004).
Goodman, C.H.L. and Pessa, M.V. Atomic layer epitaxy. Journal of Applied Physics 60, R65 (1986); (https://doi.org/10.1063/1.337344).
Hartmann, J.M., Feuillet, G., Charleux, M., Mariette, Atomic layer epitaxy of CdTe and MnTe. Journal of Applied Physics 79, 3035(1996); (https://doi.org/10.1063/1.361243).

* cited by examiner

METHOD FOR HETEROEPITAXIAL GROWTH OF III METAL-FACE POLARITY III-NITRIDES ON SUBSTRATES WITH DIAMOND CRYSTAL STRUCTURE AND III-NITRIDE SEMICONDUCTORS

The invention concerns the heteroepitaxial growth of III-Nitride semiconductors (III-Nitrides), i.e. GaN, InN, AlN and their alloys, on single crystal or polycrystalline diamond (C atoms) substrates but is also applicable on the element IV (atoms with 4 valence electrons) substrates with diamond crystal structure of Si, Ge, or an alloy with chemical formula $Si_xC_yGe_{1-(x+y)}$, whereby $0 \leq x, y \leq 1$, $0 \leq x+y \leq 1$ and at least x or y less than 0.5, and in particular with $y \leq 0.2$.

The III-Nitrides are compound semiconductors consisting of atoms of group-III metal elements (atoms with 3 valence electrons) such as aluminum (Al), indium (In), gallium (Ga) and atoms of the group-V (5 valence electrons) element nitrogen (N). Specifically, the invention concerns the growth of thin films of Gallium Nitride (GaN) or other III-Nitride with good structural quality and surface smoothness, with the (0001) crystallographic orientation which corresponds to Ga-face polarity, i.e. III metal-face polarity, on substrates of polycrystalline or single crystal diamond or other element IV substrates with diamond crystal structure and ultimately concerns the growth of (0001) heterostructures of the III-nitride semiconductors with III metal-face polarity, for the fabrication of devices such as high electron mobility transistors (HEMTs) and the growth is carried out by Molecular Beam Epitaxy (MBE) using a source that produces plasma of nitrogen gas (PAMBE: Plasma-Assisted MBE) for the creation of the beam of active nitrogen species (atoms and excited molecules).

The growth of III-Nitrides on diamond substrates corresponds to a new materials system with unique properties due to combination of the physical and chemical properties of the III-nitride semiconductors and diamond: The III-Nitride semiconductors exhibit bandgap (Eg) values from infrared (~0.65 eV for InN) to ultraviolet (~6.15 eV for AlN) energies, high electron saturation velocities and mobilities, high breakdown electric-fields and high operation temperature (for the wide bandgap compounds, such as GaN with Eg=3.42 eV), high chemical stability and thermal conductivity and the presence of spontaneous and piezoelectric polarization along the c-axis, which result to internal electric fields and the formation of two-dimensional gases of electrons (or holes) in III-Nitride heterostructures. Diamond is characterized by unique mechanical and thermal properties, such as higher values of hardness and thermal conductivity compared to other materials and it also exhibits significant chemical stability. The heterostructures are grown epitaxially and consist of multi-layer materials combining different semiconductors and can exhibit new electrical and optical properties in comparison to the constituent semiconductor materials. The III-Nitride wide bandgap semiconductors are developed mainly due to their existing or foreseen applications in the fabrication of light emitting devices [light emitting diodes (LEDs) or laser diodes (LDs)] operating at wavelengths in the visible or ultraviolet spectrum range and of ultraviolet photodetectors and of electronic devices of high frequency, high power and high temperature operation.

The III-Nitride semiconductors exhibit significantly higher polarization values in comparison to the conventional III-V compound semiconductors (such as GaAs, AlAs, InAs, InP) and at III-Nitride heterojunctions (e.g. AlN/GaN) two-dimensional electron gas (2DEG) of extremely high density, in the range of $10^{13}$ cm$^{-2}$, can be formed without the introduction of donor impurities in the layers. In the recent years, this has resulted to the III-Nitride heterostructures being the most important research field of new semiconductor materials for the fabrication of High Electron Mobility Transistors (HEMTs) [E. T. Yu et al., J. Vac. Sci. Technol. B 17, 1742, (1999)]. In today's era, the GaN HEMT (HEMT based on GaN heterostructure) transistors on the usual sapphire substrates exhibit power density around 10 W/mm at 10 GHz [Yi-Feng Wu et al., IEEE Trans. on Elect. Dev. 48, 586 (2001), Vinayak Tilak et al., IEEE Elect. Dev. Let. 22, 504 (2001)], whilst on SiC compound substrates the power density rises to 32 W/mm [Y. F. Wu et al., IEEE Electron. Dev. Let. 25, 117 (2004)]. At these high power levels, thermal effects become very critical: the increase of temperature in the semiconductor structure not only reduces the performance of the devices but also accelerates their degradation and reduces their reliability. This effect becomes more intense when the size of the devices is small and the current density reaches very high values.

Thus the effective removal of the heat from the active channel of the HEMT devices becomes necessary. Diamond exhibits the highest value of thermal conductivity of 22 W/Kcm [E. Worner, et al., Diamond Relat. Mater. 5, 688 (1996), D. J. Twitchen et al., Diamond Relat. Mater. 10, 731 (2001)] compared to other materials, being the ideal substrate for the growth and fabrication of high power HEMT devices. Si substrates also offer significantly higher thermal conductivity compared to sapphire. It is anticipated that a diamond substrate could extract efficiently the heat from the HEMT channel, reducing the temperature of the device and increasing its possible power density. The first experimental study toward this direction was reported recently [J. Kuzmik et al., J. Appl. Phys. 109, 086106 (2011)], where AlGaN/GaN heterostructures grown on (111) diamond substrate exhibited the lowest thermal resistance (3.5 K mm/W) that has been reported for a HEMT fabricated from a GaN heterostructure.

The thermal effects and the extraction of heat are also important for the light emitting devices, such as LEDs and LDs. The heat extraction is a very significant technological issue in the use of white light LEDs for general lighting applications, which is usually called as solid state lighting.

In addition to the improved heat extraction, the heteroepitaxial growth of III-Nitrides on diamond substrates will allow to combine, in general, the physical and chemical properties of III-Nitrides and diamond for various applications in devices and microsystems.

In the last years, a significant research is ongoing with the aim to integrate GaN and other III-Nitride semiconductors with diamond substrates. However, the growth of GaN on diamond substrates faces significant difficulties and similar issues exist for other substrates with diamond crystal structure:

1) The III-Nitride semiconductors have hexagonal wurtzite crystal structure, while diamond has cubic crystal structure. Only the (111) diamond surface exhibits the same symmetry with the (0001) plane of GaN and the other III-Nitrides.
2) The crystals of GaN and diamond exhibit significant lattice misfit, being 21% in the case of the heteroepitaxy of GaN (0001) on diamond (111). The high value of misfit strain, which is induced by the lattice misfit, is relaxed during the initial stages of growth by the introduction of misfit dislocations at the epilayer/substrate interface. In addition, the three-dimensional (3D) growth mode is favored for the growth of epitaxial layers under high stress [M. Imura et al., J. Cryst. Growth 312, 368 (2010), K. Hirama et al., Jpn. J. Appl. Phys. 49, (2010)]. These effects result to the introduction of crystal defects in the grown epitaxial layers.

3) The large difference in the thermal expansion coefficients of diamond ($1.1\times10^{-6}$/K) and GaN ($3.2\times10^{-6}$/K) results to the introduction of a biaxial tensile stress in the GaN layer, parallel to the surface, during the cooling of the sample to room temperature at the end of the growth, resulting to the formation of microcracks. The presence of microcracks prohibits the fabrication of devices based on electron transport parallel to the surface plane.

4) The small size (surface area less than 1 cm$^2$) and the high cost of the commercially available single crystal diamond substrates, make difficult their use at the research stage and almost impossible their commercial exploitation. It should be pointed out here that the size and cost is not a problem for polycrystalline diamond substrates. Polycrystalline diamond wafers are commercially available with diameters up to 3-inch and are more economical. However, in this case a significant disadvantage is that epitaxial growth occurs on a mosaic of crystalline grains of the substrate, with various crystallographic orientations.

5) It is needed to control the orientation and the polarity of the GaN layers. If the III-Nitrides are grown with the c-axis vertical to the substrate surface and the direction c, which is indicated as [0001], coincides with the vertical direction that exits from the substrate pointing above its surface, then the epitaxial layer has Ga-face polarity—III metal-face polarity for the III-Nitrides, in general—and its surface orientation is (0001). In the case that this is valid for the opposite direction-c, indicated as [000-1], the epitaxial layer has N-face polarity and its surface orientation is (000-1) [E. S. Hellman, MRS Int. J. Nitride Semicond. Res. 3, 11 (1998), B Daudin et al., Appl. Phys. Left. 69, 2480 (1996)]. In the case of (0001) Ga-face polarity film, i.e. III metal-face in general for III-nitrides, there is a single bond parallel to the [0001] growth direction between each Ga (III metal) atom to a N atom of the next atomic plane along the [0001] growth direction. In the case of (000-1) N-face polarity film, there is a single bond parallel to the [000-1] growth direction from each N atom to a Ga (III metal) atom of the next atomic plane. The polarity of {0001} thin films [i.e., orientation either (0001) or (000-1)] is a crucial factor in the epitaxial growth of the III-Nitride semiconductors because it affects the properties of the surface and the bulk of the semiconductor layers and eventually the performance of devices. According to literature reports and our own experiments, the N-face polarity results to III-Nitride surfaces with increased roughness in comparison to surfaces of III (Ga, In, Al) metal-face epitaxial layers, hindering the development of device heterostructures with abrupt interfaces. The III metal-face polarity is necessary for the realization of HEMT devices with normal (not inverted) 2DEG channel [M. J. Murphy et al, J. Vac. Sci. Technol. B 17, 1252 (1999)]. In addition, the growth of GaN or other III-Nitrides with the (0001) orientation, on polycrystalline diamond substrates, requires the oriented growth of GaN along the c-axis on a mosaic of crystallographic orientations at the substrate surface.

An alternative to the difficult heteroepitaxial growth of GaN on diamond may be provided by techniques combining the separation of III-Nitride heterostructures/epilayers from their substrates used in epitaxial growth and their attachment on diamond substrates [D. Francis et al., in: Proceedings of the CS MANTECH, Austin, Tex., 133 (2007), D. Francis, et. al, Diamond Relat. Mater. 19, 229 (2010), Q. Diduk et al., Electron. Lett. 45, 758 (2009)]. However, a significant thermal resistance is expected at a bonded III-Nitride/diamond interface.

The heteroepitaxial growth of III-Nitrides on diamond substrates by PAMBE was initially reported by C. R Miskys et al. [C. R. Miskys et al., Appl. Phys. Left. 82, 290 (2003)]. They have grown n-type (Si-doped) AlN {0001} layers with thickness of 500 nm on single crystal p-type (boron-doped) diamond substrates of {100} orientation and fabricated p-diamond/n-AlN heterojunction diodes, which exhibited rectifying characteristics and light emission at 2.7 eV with a secondary weak peak at 4.8 eV. In a subsequent paper, these two emission lines were attributed to recombination centers due to oxygen impurities and defects at the interface, respectively [C. R. Miskys et al., Appl. Phys. Left., 85, 3699 (2004)]. The 500 nm thick AlN layers grown on diamond {100} substrate exhibited {0001} orientation with coexistence of domains exhibiting two different epitaxial relationships with the substrate, whilst for the (111) diamond substrate was reported that 80% of the 500 nm AlN layer was grown with {0001} orientation and 20% with (10-11) orientation [G. Vogg et al., J. Appl Phys., 96, 895 (2004)]. The polarity of the AlN {0001} layers was not determined [C. R. Miskys et al., Appl. Phys. Lett., 85, 3699 (2004)].

The first growth of GaN on diamond (110) substrate was reported by Hageman et al. using MOCVD and HVPE epitaxial growth techniques [P. R. Hageman et al., Thin Solid Films 443, 9 (2003)]. The grown GaN layers were polycrystalline and not of good quality. The overgrowth of the initial MOCVD GaN layer by HVPE did not result to a film but it consisted of large hexagonal pillars with a height of more than 100 μm. Both of the MOCVD and HVPE epitaxial growth techniques use ammonia (NH$_3$) gas. A 10 nm AlN nucleation layer has been grown initially on the diamond substrate by MOCVD using NH$_3$ gas for nitrogen source.

Recently, the successful growth of crystalline GaN on single crystal diamond (001) by MOCVD [G. W. G. van Dreumel et al, J. Appl. Phys. 110, 013503 (2011)] and on diamond (111) by ammonia-source MBE (NH$_3$-MBE) [A. Dussaigne et. al, J. Cryst. Growth 311, 4539 (2009)], have been reported. Dussaigne et. al used ammonia gas for nitrogen source and grew Ga-face GaN (0001) films on single crystal diamond (111) substrates using 100 nm thick AlN nucleation layer. The GaN layers exhibited good optical properties but cracks existed for GaN thickness above 0.25 μm. The first AlGaN/GaN HEMT was realized on diamond (111) by NH$_3$-MBE [A. Dussaigne et al., Jpn. J. Appl. Phys. 49, 061001 (2010), M. Alomari et al., Electron. Lett. 46, 299 (2010)]. Very recently, growth of AlGaN/GaN HEMT structures by MOCVD was also reported on diamond (111) substrates [K. Hirama et al., Appl. Phys. Lett. 98, 162112 (2011)]. There have been only two published papers for the growth on polycrystalline diamond substrates, with discouraging results due to intense morphological irregularities of the surface [G. W. G. van Dreumel et al., Diamond Relat. Mater. 19, 437 (2010), A. Y. Polyakov et. al, J. Vac. Sci. Technol., 28, 1011 (2010] and there has been no report for the polarity of the GaN layers and the realization of devices on polycrystalline diamond.

The polarity of GaN (0001) films on the commonly used substrates of sapphire and SiC (0001) compound is controlled by all growth techniques. For PAMBE, the polarity on sapphire depends on the kind (GaN or AlN) of the nucleation layer [M. J. Murphy et al, J. Vac. Sci. Technol. B 17, 1252 (1999)] or the substrate nitridation [S. Mikroulis et al, Appl. Phys. Lett. 80, 2886 (2002)]. In the case of SiC (0001) compound substrates, the polarity is controlled by the used face of the SiC (0001) substrate, so that Ga-face GaN (0001) is grown on Si-face SiC (0001) for either GaN or AlN nucleation layers [O. Brandt et al, Appl. Surf. Sci. 175-176, 419 (2001)].

When considering the state of the art, it is unknown how to achieve Ga-face (III metal-face) polarity in PAMBE growth of GaN on single crystal or polycrystalline diamond substrates, while similar difficulties appear on substrates with diamond crystal structure such as Si.

The object of the invention is to develop advanced III-Nitride heterostructure materials that will enhance the high power operation capabilities of III-Nitride devices such as transistors and light emitting diodes (LEDs) and enrich the range of III-Nitride device functions with promising new applications in sensors and microsystems, by monolithic integration with element IV substrates, exhibiting diamond crystal structure, considering the physical and chemical properties, technological maturity and cost. A further object of the invention is to define a method for the production of such advanced III-Nitride heterostructure materials.

The invention is defined in the independent claims. The dependent claims define further features which offer further advantages.

The invention concerns the heteroepitaxial growth of III-Nitrides on substrates of single crystal diamond, polycrystalline diamond, Si, Ge, or in general an alloy of Si, Ge and C. It discloses a method of heteroepitaxial growth of III-Nitrides that solves the problem of growing GaN thin films and any other III-nitride with (0001) orientation and Ga-face polarity (III metal-face polarity for III-nitrides in general) independently of the crystallographic orientation of the diamond substrate. Thus it enables the growth of heterostructures based on GaN and other III-Nitrides with the (0001) orientation and III metal-face polarity on all the crystallographic orientations {001}, {110} or {111} of the commercially available single crystal diamond substrates and the {001}, {110}, {111} and {311} orientated grains of the commercially available polycrystalline substrates. The III metal-face III-Nitride (0001) material is required for the fabrication of high power HEMT devices with normal 2DEG channel, which is the optimum HEMT configuration. The epitaxial layers of III-Nitrides with III metal-face polarity are also characterized (for any epitaxial growth technique) by higher crystal purity, smoother surfaces and more abrupt interfaces compared to N-face material, which gives a significant performance advantage for devices. A significant advantage concerns the realization of device quality III-Nitride material on the polycrystalline diamond substrates which provides realistic potential for exploitation compared to single crystal diamond.

The invented method is based on the initial growth on the diamond substrate of a thin AlN (0001) nucleation layer with thickness less than 5 nm, by a variation of MBE technique which uses plasma source with nitrogen ($N_2$) gas (nitrogen plasma source) and is commonly called Plasma-Assisted MBE (PAMBE). In our experiments we have found that the polarity of the AlN (0001) nucleation layer switches from Al-face to N-face when the thickness of AlN exceeds few nm, even if the AlN is grown under N-rich conditions (e.g. flux ratio Al/N=0.6). The exact thickness for this effect depends on the exact growth conditions but it was found impossible to preserve the Al-face polarity for a 5 nm thick AlN film and experiments with 15-90 nm AlN nucleation layers on single crystal (111), (110) and (001) diamond substrates had resulted to mixed polarity or N-face polarity epilayers. Experiments of growing AlN nucleation layers at a substrate temperature of 800° C. with growth rate of 210 nm/h and stoichiometric AlN flux ratio (equal to 1.0) indicated that the AlN nucleation layer should be kept below 3.5 nm, with an optimum value being 1.7±0.1 nm. Up to this AlN thickness, a 2D growth mode is followed and the AlN layer uniformly covers the diamond substrate, preserving also its polarity.

The observed phenomenon of polarity inversion from metal-face to N-face after few nm of AlN growth under stoichiometric or even N-rich conditions is not disclosed by prior art and this influence of the AlN thickness is the significant finding of this invention. In general, AlN is a preferable nucleation layer on various substrates due to its better wetting behavior compared to GaN and because a GaN layer grown on AlN is subject to compressive stress (GaN has larger lattice constant compared to AlN), which helps to partially compensate usual tensile thermal stresses (after cooling at the end of growth) that can create cracks. In PAMBE growth on sapphire substrates, the growth of AlN nucleation layer is used to select the metal polarity but this does not change with increasing thickness of AlN.

The invented method to select the (0001) orientation with III metal-face polarity, in the heteroepitaxy of III-Nitrides, independently of the diamond surface orientation, provides a significant advantage to the PAMBE technique, compared to other epitaxial growth techniques, for use in the frame of a commercially viable III-nitride semiconductors technology based on polycrystalline diamond substrates. An inherent characteristic of PAMBE is the accurate control of the growth process down to sub-atomic plane level, with in-situ real-time monitoring capability of the growth procedure by the RHEED technique. These features give PAMBE an advantage compared to other epitaxial growth techniques for development of advanced nanoelectronic HEMTs and other nanotechnology devices. PAMBE is also a lower temperature growth technique compared to $NH_3$-MBE or MOCVD and this is a significant advantage for minimizing thermal stresses that arise from different thermal expansion coefficients of substrate and epilayer. This is particularly important in the case of GaN on diamond or GaN on Si substrates, due to the tensile thermal stress that leads to cracking of the epilayers for thickness above a critical value. In our experiments we could grow crack-free GaN layers on diamond substrates with thickness above 1 µm while cracks were reported for thickness above 0.25 µm for $NH_3$-MBE grown GaN on diamond (111).

The Al-face AlN (0001) nucleation layers can be overgown by a GaN layer, or a layer of other III-nitride with the general chemical formula $In_yGa_zAl_{1-(y+z)}N$, whereby $0 \le x, y, z \le 1$ and $0 \le y+z \le 1$. Then the GaN or $In_yGa_zAl_{1-(y+z)}N$ layer may be overgown by various layers of III-Nitrides forming the desired III metal-face (0001) heterostructure for devices, such as the HEMTs and LEDs.

The invented method can be applied also in the growth of III-Nitrides on the element-IV substrates with diamond crystal structure Si, Ge, or an alloy with chemical formula $Si_xC_yGe_{1-(x+y)}$, whereby $0 \le x, y \le 1$, $0 \le x+y \le 1$ and x or y less than 0.5.

Preferred embodiments of the invention will be described with reference to FIGS. 1 to 9. In particular:

FIG. 2A is an AFM micrograph for a 2×2 μm² scan area and FIG. 2B is a SEM micrograph.

Figure 9A:
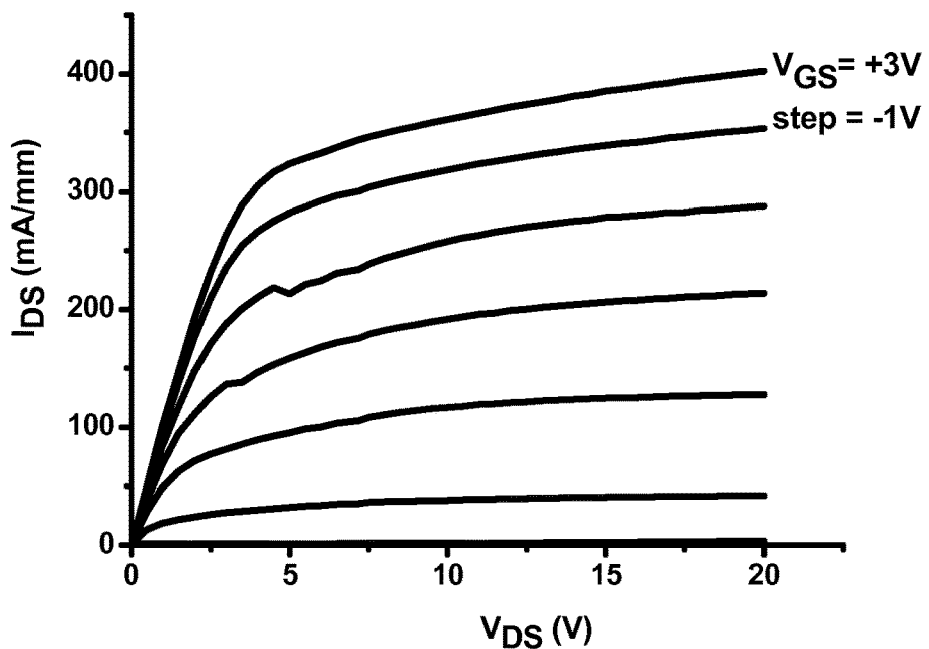
Figure 9B:
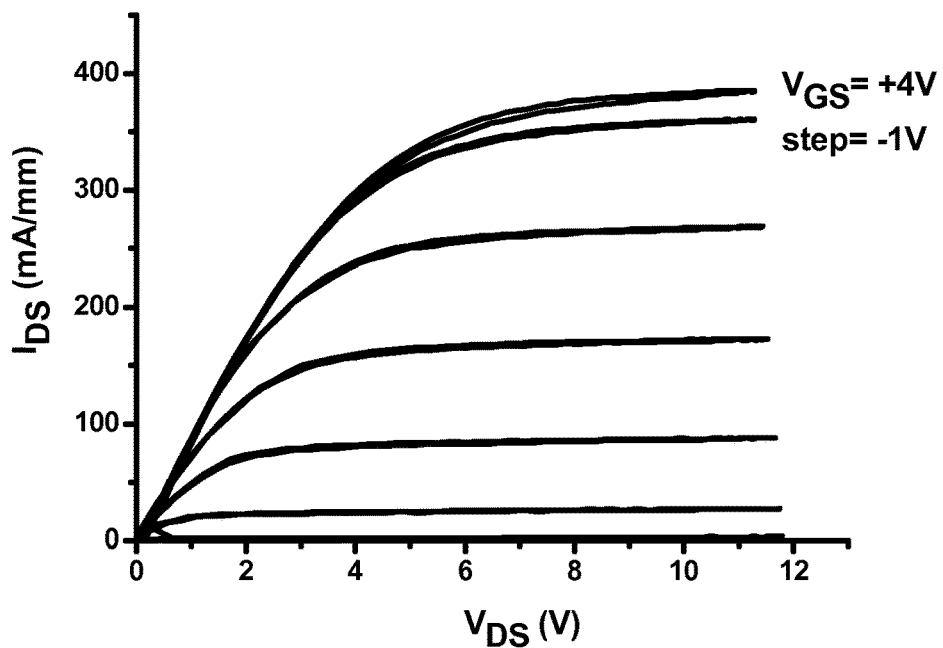

FIGS. 9A and 9B exhibit I-V characteristics of HEMT transistors based on AlN/GaN heterojunction, which have been fabricated on diamond substrates. FIG. 9A concerns HEMT with gate length Lg=0.5 μm on single-crystal diamond {111} substrate and FIG. 9B concerns HEMT with gate length Lg=1 μm on polycrystalline diamond substrate.

This invention enables the growth of heterostructures of III-Nitride semiconductors of (0001) orientation, with III metal-face polarity (Ga-face in the case of GaN), on single crystal or polycrystalline diamond, when the epitaxy is carried out using a nitrogen plasma source as in the case of the PAMBE technique. The invention can be applied also to substrates of other group-IV elements (atoms with 4 valence electrons) with diamond crystal structure, such as silicon (Si), germanium (Ge) or an alloy with chemical formula $Si_xC_yGe_{1-(x+y)}$, whereby $0 \leq x,y \leq 1$, $0 \leq x+y \leq 1$, in particular $y \leq 0.2$, and x or y less than 0.5, and solves the problem of growing by PAMBE III-Nitride heterostructure materials of III metal-face, which has significant applications in the fabrication of devices such as the GaN based HEMTs. This has not been possible until now for III-Nitride heterostructures on polycrystalline diamond substrates for any epitaxial growth technique (such as MOCVD, HVPE, $NH_3$-MBE, PAMBE).

Figure 1:
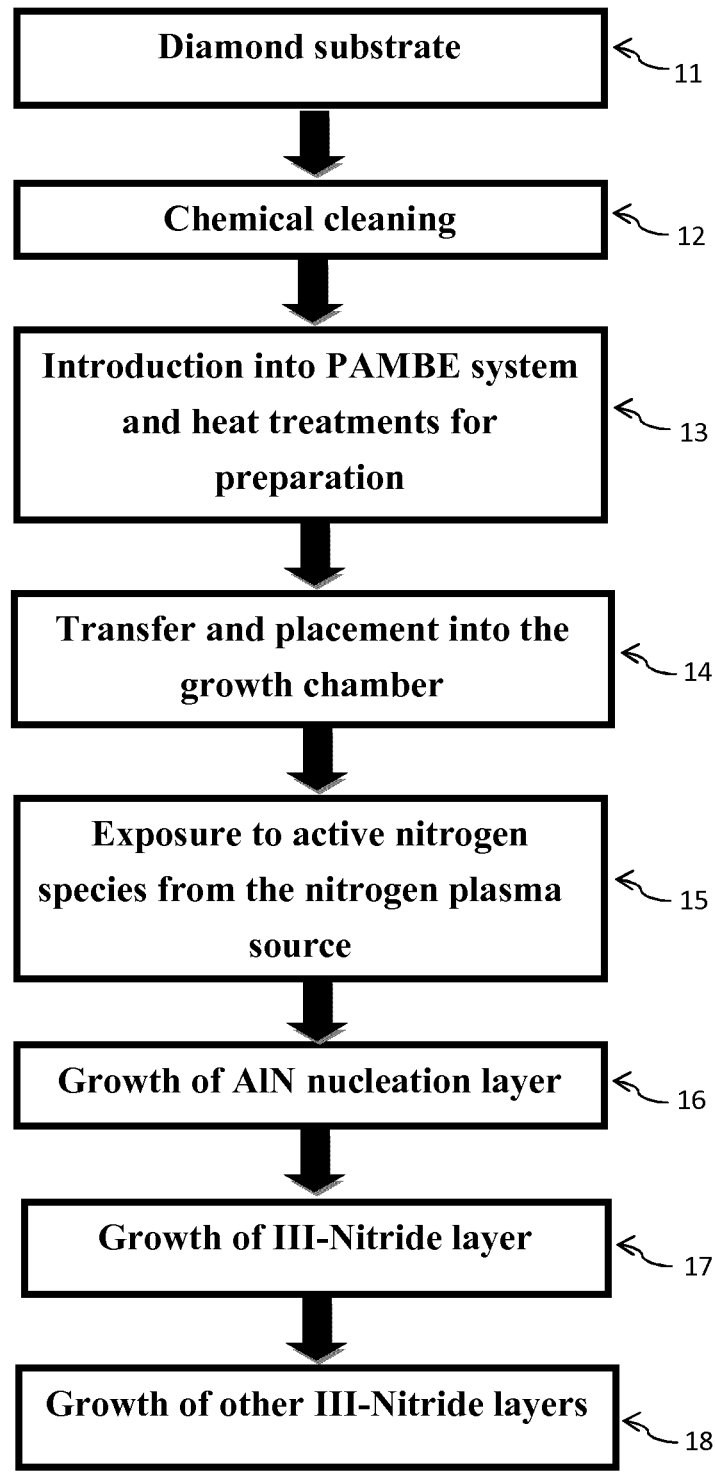
FIG. 1 is a process-flow diagram describing the application of the invented method for the growth of III-Nitrides with III metal-face polarity on single crystal or polycrystalline diamond substrates.

One way to apply the present invention, which does not exclude other ways and variations, within the scope of the claims and their equivalents, is the following series of steps that are described in FIG. 1:

Diamond substrates 11 are used, which preferentially have been treated by their manufacturer to terminate-passivate the diamond surface by binding hydrogen (H) atoms, without to exclude a treatment that terminates-passivates the diamond surface by binding oxygen (O) atoms. Initially the diamond substrates are prepared outside of the MBE system (ex-situ) 12 to remove possible organic contaminants from their surface (degreasing). This process includes sequential treatment of the substrate in organic solvents such as trichloroethylene, acetone and isopropyl alcohol. Finally, the substrate is rinsed thoroughly in deionized water and is dried under $N_2$ gas blow.

Then the substrate is placed on a special holder and is introduced into the vacuum system 13, which preferentially is a MBE system with more than one chambers of ultra high vacuum (UHV). In the MBE preparation chamber, the substrate is placed on a heating stage where it is heated (indicatively, at T=700° C. for 30 min) to remove (outgas) gases, such as water vapor and other contaminants that have been adsorbed on its surface. The outgassing process secures the high purity of the surface of the substrate, in order to avoid both the contamination of the growth chamber and the unintentional incorporation of impurities in the epitaxial layers.

Then the substrate is introduced into the growth chamber 14 of the MBE system using a plasma source for nitrogen ($N_2$) gas (PAMBE) and it is placed on the manipulator where its temperature is gradually increased to 800° C. At the same time, the nitrogen plasma source has been switched on and it is used to expose the diamond surface to active nitrogen species (nitridation) at 800° C. for 1 min while operating with 100 W of induced RF power and 1.0 sccm $N_2$ gas flow-rate. The exposure to nitrogen (nitridation) time can be adjusted according to the conditions of operating the nitrogen plasma source (RF power and flow of $N_2$ gas) and the used substrate temperature. The exposure of the diamond substrate to active nitrogen species (nitridation) is not obligatory and the invention works also without it.

The next step is the key part of this invention and concerns the growth of the appropriate AlN (0001) Al-face nucleation layer 16, which secures the desired (0001) orientation with III metal-face polarity (Al-face for AlN, Ga-face for GaN, In-face for InN and in general (Al, Ga, In)-face for $In_xAl_yGa_{1-(x+y)}N$ whereby $0 \leq x,y \leq 1$ and $0 \leq x+y \leq 1$) for the overgown III-nitride layers. The thickness of the AlN nucleation layer must be less than 5 nm, preferably less than 3.5 nm. If the growth of AlN by PAMBE is continued for larger thickness it is impossible to preserve the desired (0001) orientation with III-metal-face polarity for any crystallographic orientation close to the {001}, {110} or {111} orientations of the commercially available single crystal substrates and the {001}, {110}, {111} and {311} orientations of the crystal grains of the available polycrystalline substrates. The AlN nucleation layer indicatively can be grown at high growth temperature of approximately 800° C. with stoichiometric flux ratio Al/N=1.0, which means that the incident flux of Al atoms ($F_{Al}$) has been adjusted to be equal to the incident flux of N atoms ($F_N$), so that $F_{Al}=F_N$ on the substrate surface. The incident flux of atoms refers to the overall supply of atoms to the substrate and part of these atoms may be contained in reactive molecules of the incident beam, such as the excited nitrogen molecules produced from the nitrogen plasma source. Indicative conditions for the proper AlN nucleation layer are a thickness of 1.7 nm and growth rate of 210 nm/h. Up to this thickness, AlN is grown under two-dimensional (2D) growth mode while transition to three-dimensional (3D) growth mode occurs at higher AlN thicknesses, as indicated from the observation of Reflection High Energy Electron Diffraction (RHEED) patterns consisting of streaks (2D growth) instead of spots (3D growth).

After the completion of the AlN (0001) Al-face nucleation layer, the growth is interrupted, preferentially by stopping the incidence of all the beams on the surface. Then the substrate temperature is changed, if needed, to the desired temperature for the growth of the next III-nitride layer, which indicatively is in the range 700-715° C. for GaN growth and the operation conditions of the plasma source are readjusted if they differ from those used during the growth of the AlN nucleation layer. Then the next III-nitride layer is grown with (0001) orientation and III metal-face polarity (FIG. 1, 17). This layer is preferentially a GaN buffer layer of (0001) orientation with Ga-face polarity and is grown at a temperature in the range 700-715° C. with flux ratio Ga/N=1.6. The substrate temperature and the Ga/N flux ratio are adjusted with the assistance of RHEED monitoring to avoid the accumulation of metallic Ga on the surface of GaN, securing conditions for full evaporation of excess Ga atoms. The optimum thickness of this GaN layer is between 0.5 and 1 μm in order to achieve smooth surfaces and interfaces. Layers of other III-nitrides may be inserted within this GaN layer.

On top of this GaN (0001) Ga-face layer, other layers of III-nitrides may be grown 18 as required to form the desired heterostructures for devices such as HEMT transistors, light emitting diodes (LEDs), laser diodes (LDs) and various kinds of sensors.

Instead of the GaN (0001) Ga-face buffer layer 17, a different III-nitride layer of (0001) orientation with III metal-face polarity, such as InN or any compound with chemical formula $In_xAl_yGa_{1-(x+y)}N$ whereby $0 \leq x, y \leq 1$ and $0 \leq x+y \leq 1$, can be grown on the AlN (0001) Al-face nucleation layer according to the known art. Then additional III-Nitride layers 18 can be grown in order to form the desired epitaxial structure for a particular application.

Figure 2A:
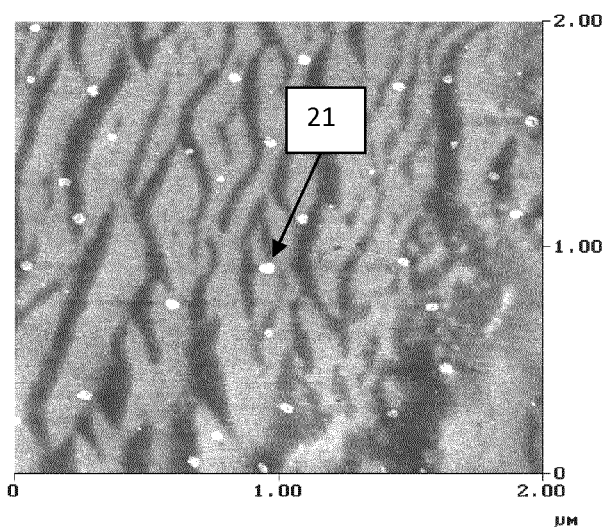
FIGS. 2A and 2B show the surface of a 1.7 nm thick AlN nucleation layer grown on polycrystalline diamond substrate.
Figure 2B:
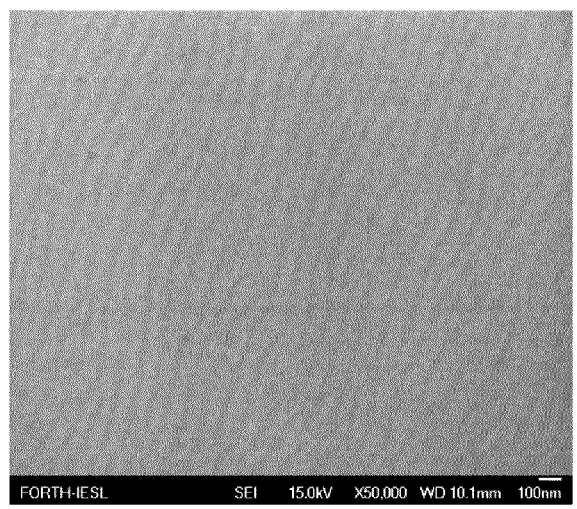

The surface morphology of the 1.7 nm AlN (0001) Al-face nucleation layer has been studied by AFM and SEM microscopies and typical results, for growth on polycrystalline diamond substrates, are shown in FIGS. 2A and 2B, respectively. Both micrographs indicate that the surface of the polycrystalline diamond has been covered by a uniform 1.7 nm thick AlN layer so that steps existing on the substrate surface have remained visible, which is indicative for the 2D growth mode of the AlN nucleation layer. In the AFM micrograph of FIG. 2A, sparse points also appear where the initiation of formation of 3D islands is anticipated 21. The rms roughness of the surface of the 1.7 nm AlN layer was determined equal to 0.32 nm from the AFM micrograph of FIG. 2A.

Figure 3:
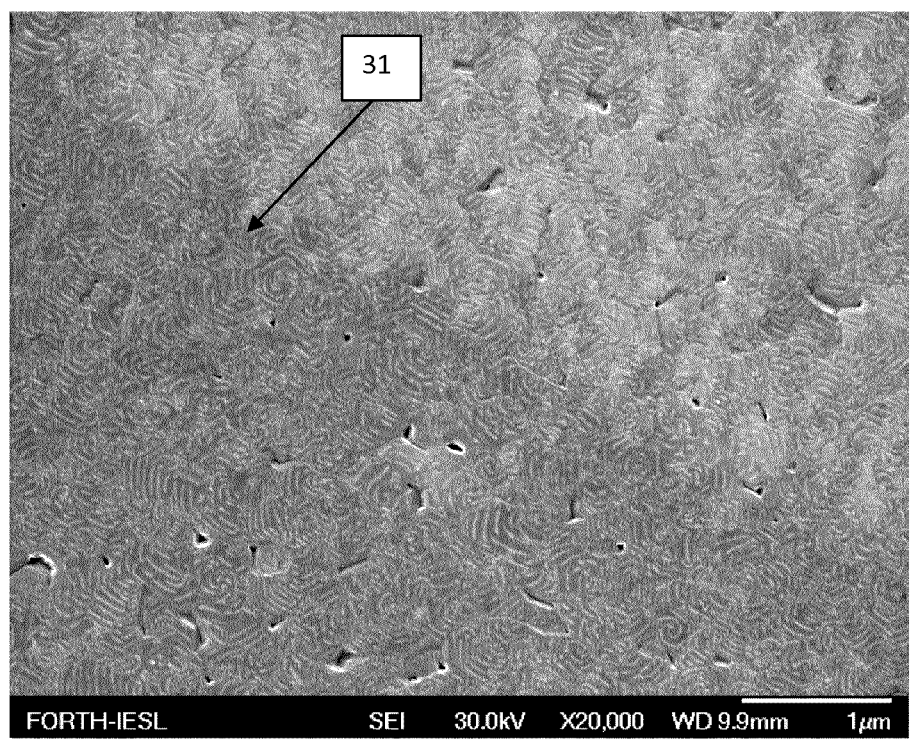
FIG. 3 is a SEM micrograph showing the surface of a Ga-face GaN (0001) layer, grown on polycrystalline diamond substrate.

FIG. 3 is a SEM micrograph showing the surface morphology of a 1 μm GaN (0001) Ga-face layer grown on polycrystalline diamond according to the invented method. A remarkable observation is the similar morphology of the two regions of the surface separated by a grain boundary 31.

Figure 4A:
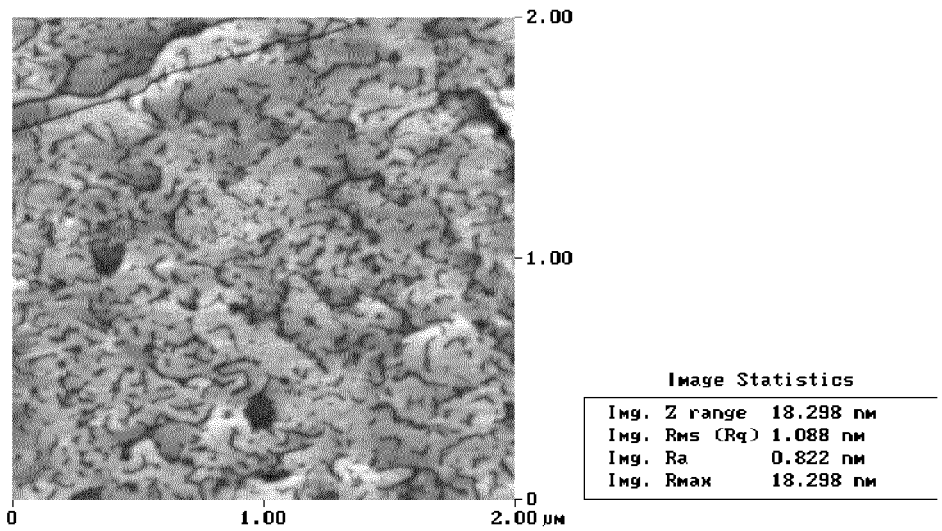
FIGS. 4A and 4B are AFM micrographs for 2×2 μm² scan area showing the surface of two Ga-face GaN (0001) layers, grown on two polycrystalline diamond substrates having different crystal mosaicity.
Figure 4B:
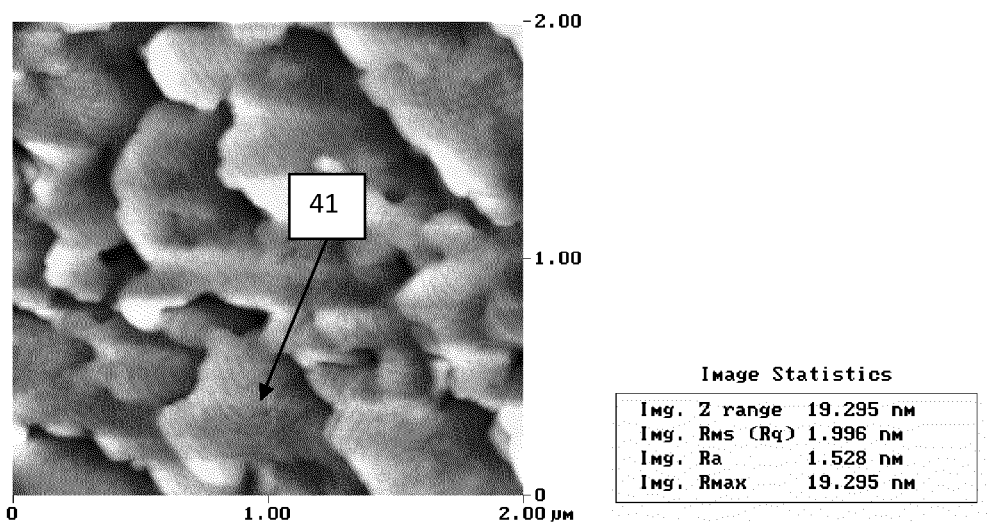

FIG. 4 gives two AFM micrographs for 2×2 μm² scan area for the surface of two layers of 1 μm GaN (0001) Ga-face, which have been grown on polycrystalline diamond substrates with different crystal mosaicity (different mixture of grain orientations). The rms value of surface roughness was determined equal to 1.1 nm for FIG. 4A and 2.0 nm for FIG. 4B. In the micrograph of FIG. 4B, surface steps 41 with height of 1 monolayer (ML) of GaN are visible on the GaN (0001) surface, which is characteristic for the step-flow 2D growth mode.

Figure 5A:
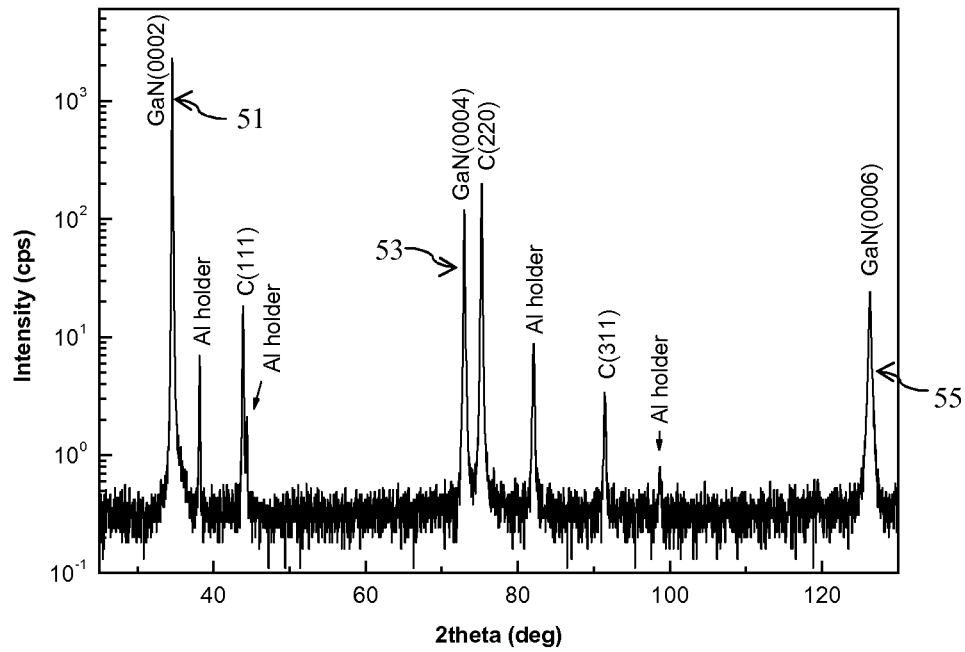
FIGS. 5A and 5B are XRD graphs showing omega-2theta scans of two Ga-face GaN (0001) layers, grown on two polycrystalline diamond substrates having different crystal mosaicity.
Figure 5B:
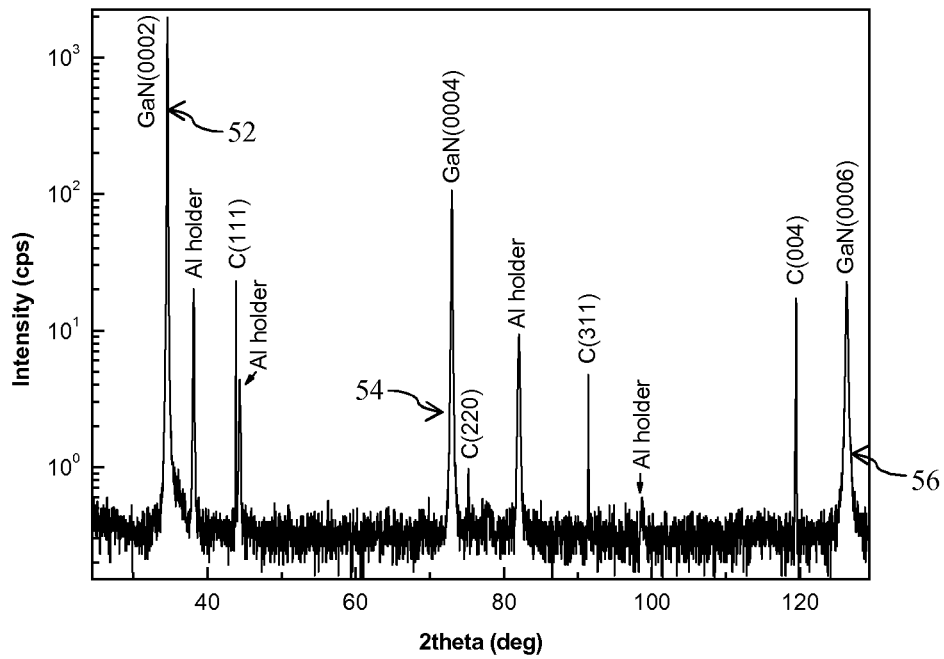

The {0001} orientation of the GaN (0001) Ga-face layers grown on polycrystalline diamond substrates is apparent in measured X-ray Diffraction (XRD) ω-2θ scans. FIGS. 5A and 5B give the measurements for two 1 μm GaN (0001) layers grown on two polycrystalline diamond substrates with different crystal mosaicity. In both cases, the only diffraction peaks observed for the GaN crystal are the GaN(0002) 51 and 52, GaN(0004) 53 and 54 and GaN(0006) 55 and 56.

Figure 6A:
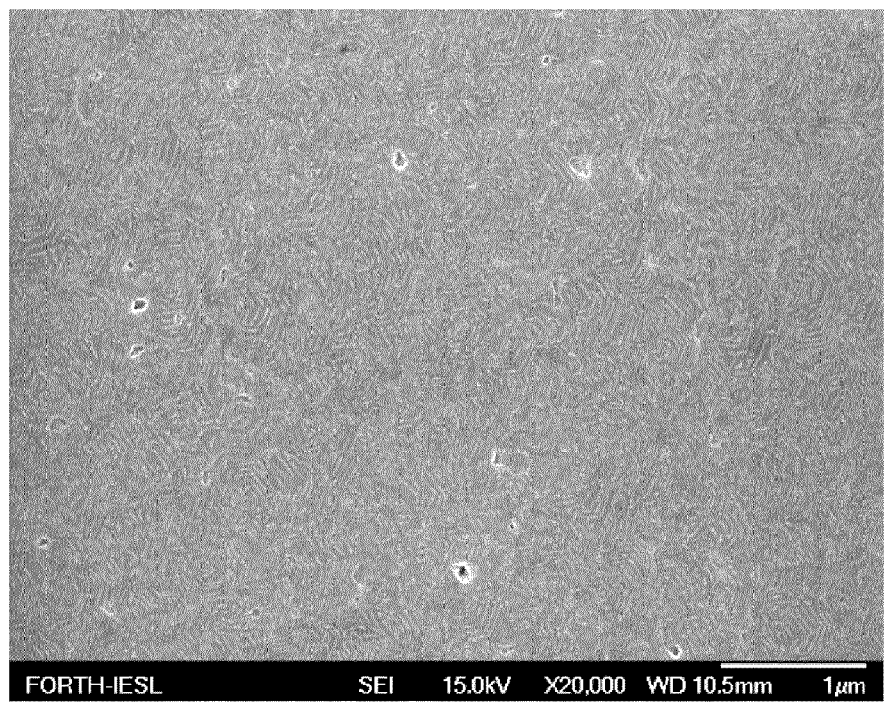
FIGS. 6A and 6B are SEM micrographs for a Ga-face GaN (0001) layer grown on polycrystalline diamond substrate. The micrographs show its surface before (FIG. 6A) and after (FIG. 6B) chemical treatment in KOH solution.
Figure 6B:
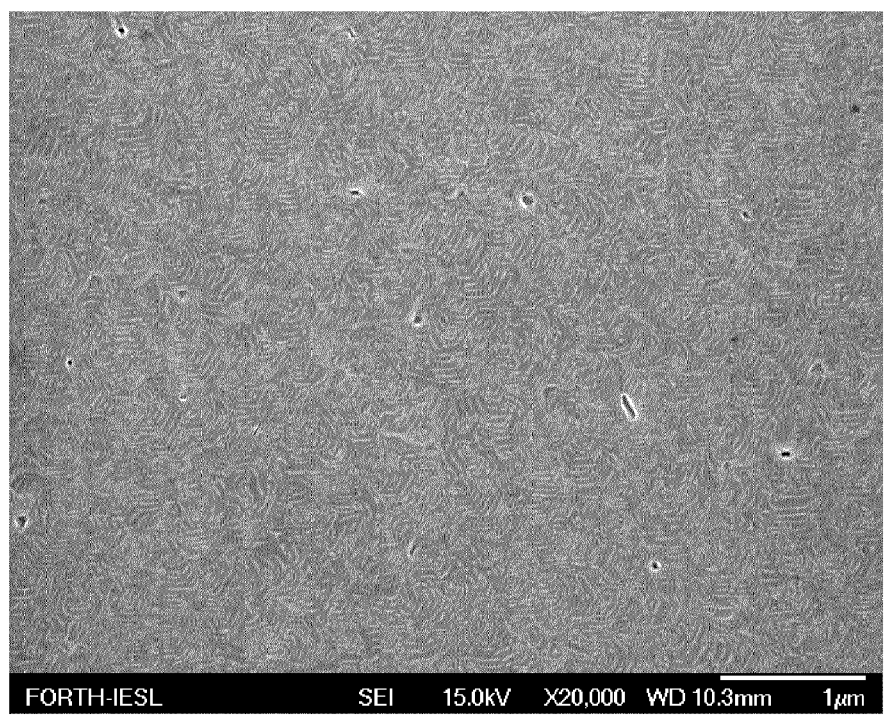

FIGS. 6A and 6B are SEM micrographs characteristic for the fact that the GaN (0001) layers grown with this method have Ga-face polarity and do not react with a KOH solution. The surface morphology of the as grown sample (FIG. 6A) has not been altered after its treatment in KOH solution (FIG. 6B). It is known that KOH solutions etch only the N-face polarity GaN {0001} films.

Figure 7:
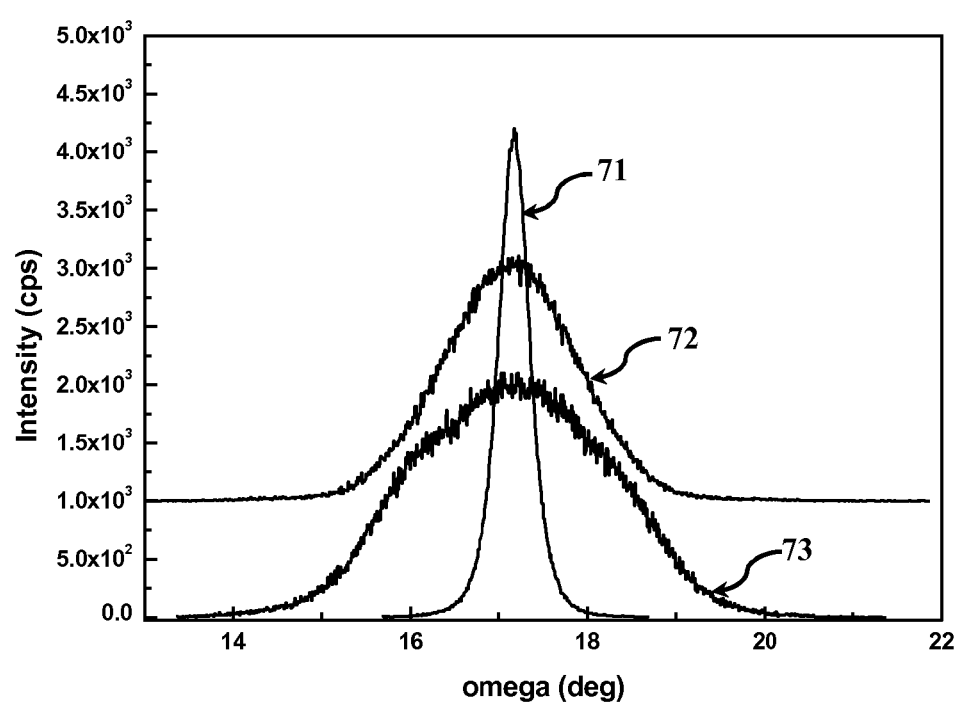
FIG. 7 shows XRD rocking curves around the (0002) reflection for three Ga-face GaN (0001) layers grown on one single crystal diamond (111) substrate and two polycrystalline diamond substrates having different crystal mosaicity.

FIG. 7 gives XRD w-scans (or rocking curves) around the (0002) reflection for three layers of 1 μm Ga-face GaN (0001) grown either on a single crystal diamond (111) 71 or on two polycrystalline diamond substrates having different crystal mosaicity 72, 73. The full width at half maximum (FWHM) of the diffraction peaks are 0.4° on the single crystal diamond (111) 71 and increases to 1.8° 72 and 2.8° 73 on the polycrystalline substrates.

Figure 8:
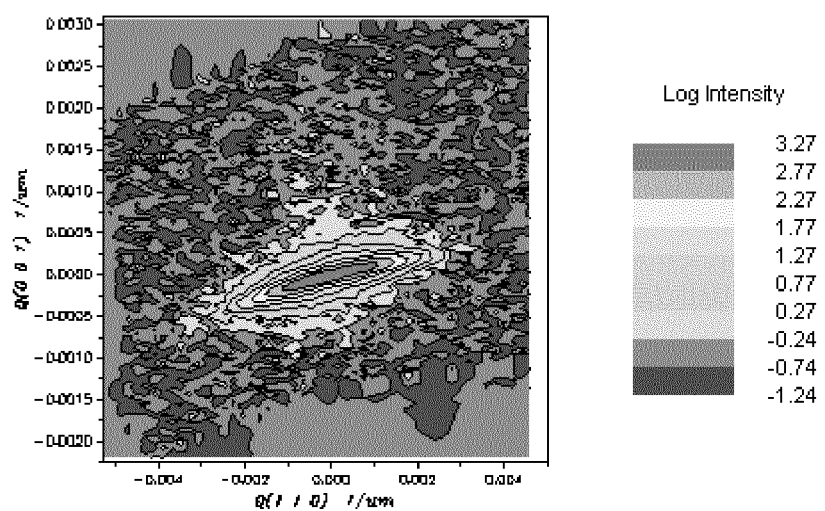
FIG. 8 shows XRD Reciprocal Space Mapping around the (0002) reflection, for a Ga-face GaN (0001) layer grown on polycrystalline diamond substrate.

FIG. 8 shows the XRD reciprocal space mapping (RSM) around the (0002) reflection for a layer of 1 μm Ga-face GaN (0001) grown on polycrystalline diamond substrate. The RSM indicates a satisfactory orientation of the GaN crystalline layer on the (0001) plane although the GaN crystal mosaicity has been increased on the polycrystalline diamond substrate.

The FIGS. 9A and 9B show the I-V characteristics of HEMT devices fabricated from III-Nitride (0001) III metal-face heterostructures that have been grown according to the present invention on substrates of either single crystal diamond (FIG. 9A) or polycrystalline diamond (FIG. 9B). The heterostructure consisted of the following layers, starting from the surface toward the substrate: 1 nm GaN/4 nm AlN/1.0 μm GaN/1.7 nm AlN/diamond.

The present invention can be used also for successful growth by PAMBE of semiconductor materials consisting of III-Nitride heterostructures of (0001) orientation with III metal-face polarity on other substrates of group-IV elements with diamond crystal structure, such as Si, Ge and in general an alloy with chemical formula $Si_xC_yGe_{1-(x+y)}$, whereby $0 \leq x, y \leq 1$, $0 \leq x+y \leq 1$, in particular with $y \leq 0.2$, and at least x or y less than 0.5. One way to achieve this, in the case of Si substrate, is the growth of the AlN nucleation layer by simultaneous exposure of the Si surface to the incident fluxes of Al atoms and active nitrogen species, but it is not excluded a very short exposure of the Si surface to the nitrogen beam before the epitaxial growth of AlN.

The invention claimed is:

1. A method of heteroepitaxial growth of III-Nitride semiconductors on a substrate achieving (0001) orientation and metal-face polarity for a first nucleation layer and subsequent layers, comprising the following steps:
   utilizing a nitrogen plasma source for molecular beam epitaxy to deposit an Al-face polarity (0001) AlN nucleation layer less than 5 nm in deposited layer thickness to minimize degradation of the epitaxial growth of the AlN layer and inversion of its polarity;
   depositing said AlN layer on a substrate independent of the crystalline surface orientation of said substrate, said substrate being polycrystalline diamond; and
   by the cooperation between said utilizing the nitrogen plasma source for epitaxy and said depositing of said AlN layer less than 5 nm in thickness, subsequently overgrowing on said AlN layer one or more additional III-Nitride compound layers while preserving said (0001) orientation and III metal-face polarity; and
   between the steps of depositing of said AlN layer and overgrowing of said AlN layer by a III-nitride compound layer, interrupting the depositing of said AlN layer and exposing said MN layer to active nitrogen species produced by the nitrogen plasma source.

2. The method according to claim 1, further comprising:
   exposing said substrate to active nitrogen species produced by the nitrogen plasma source before depositing said AlN layer.

3. The method according to claim 1, further comprising: said III-nitride compound layer being a GaN layer.

4. The method according to claim 3, further comprising:
said overgrowing by said GaN layer being carried out by Molecular Beam Epitaxy (MBE) using a solid evaporation source for a Ga beam, maintaining a temperature of said substrate at 710±40° C. and maintaining a Ga/N flux ratio in a range of 1.5±0.5, where the flux of N atoms corresponds to said active nitrogen species produced by the nitrogen plasma source and the flux of nitrogen atoms is incident on said substrate.

5. The method according claim 1, further comprising:
overgrowing said AlN layer by a III-Nitride compound layer, and overgrowing said III-Nitride compound layer by at least one layer of a III-Nitride compound.

6. The method according to claim 5, further comprising:
between said overgrowing of said layers of said one or more III-Nitride compounds, interrupting said overgrowing and during said interrupting, exposing the surface of at least one of said layers to active nitrogen species produced by the nitrogen plasma source.

7. The method according to claim 1, further comprising:
utilizing for the growth of said AlN layer Molecular Beam Epitaxy (MBE) using a solid evaporation source for the beam of Al, and maintaining a temperature of said substrate at 800±50° C.;
utilizing an Al/N flux ratio equal to 1.0±0.1, where the flux of nitrogen atoms corresponds to the active nitrogen species produced by the nitrogen plasma source and the flux of nitrogen atoms is incident on the substrate; and
depositing by said solid evaporation source a thickness of said AlN layer equal to 1.7±0.1 nm.

8. The method according claim 1, further comprising: said AlN layer being less than 3.5 nm.

* * * * *